United States Patent [19]

Held

[11] Patent Number: 4,541,889
[45] Date of Patent: Sep. 17, 1985

[54] DUAL-BELT PRESS FOR THE CONTINUOUS PRODUCTION OF LAMINATES

[76] Inventor: Kurt Held, Alte Strasse 1, 7218 Trossingen 2, Fed. Rep. of Germany

[21] Appl. No.: 629,400

[22] Filed: Jul. 10, 1984

[30] Foreign Application Priority Data

Jul. 15, 1983 [DE] Fed. Rep. of Germany ....... 3325578

[51] Int. Cl.[4] .............................................. B30B 5/06
[52] U.S. Cl. ............................ 156/583.5; 100/93 RP; 100/154; 156/555; 425/371
[58] Field of Search .................... 156/555, 583.5; 100/93 RP, 154, 151; 425/371

[56] References Cited

U.S. PATENT DOCUMENTS

| 4,193,342 | 3/1980 | Held ..................................... 156/555 |
| 4,253,391 | 3/1981 | Held ..................................... 156/555 |
| 4,285,525 | 8/1981 | Held ..................................... 156/582 |
| 4,365,548 | 12/1982 | Pankoke .......................... 156/583.5 |

Primary Examiner—Michael Wityshyn
Attorney, Agent, or Firm—Kramer and Brufsky

[57] ABSTRACT

The invention relates to a dual belt press for the continuous production of laminates with two heated, rotating endless belts running over rollers, the laminate being guided between the opposite outsides of said belts, with heating plates which, through annularly enclosed seals, contact the insides of the endless belts, and with a fluid, pressure-cushion-forming pressure medium in the spaces formed by the seals, belt insides and heating plates to exert the necessary pressing force on the laminate. To improve the transfer of heat from the heating plate to the reaction zone it is proposed that the spaces filled with the pressure cushion contain additional heat bridges which, in forming a good thermal conduction contact, are, on one side, connected to the heating plates and, on the other side, rubbingly contact the belt insides.

15 Claims, 7 Drawing Figures

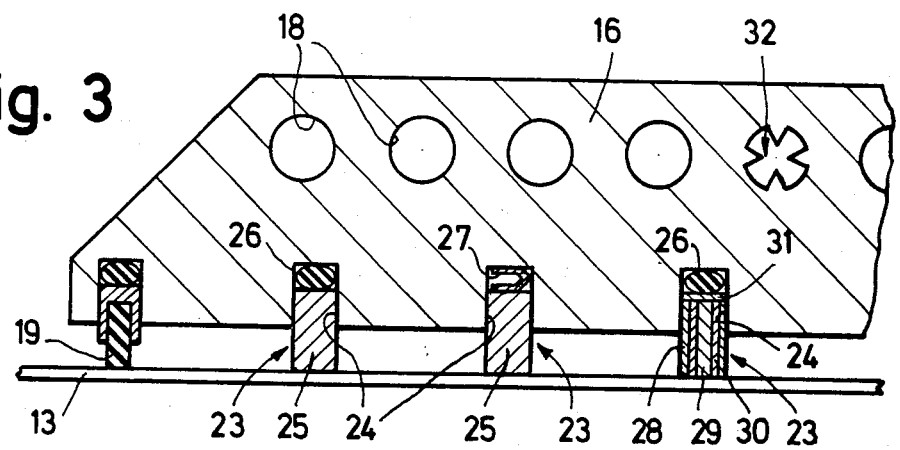
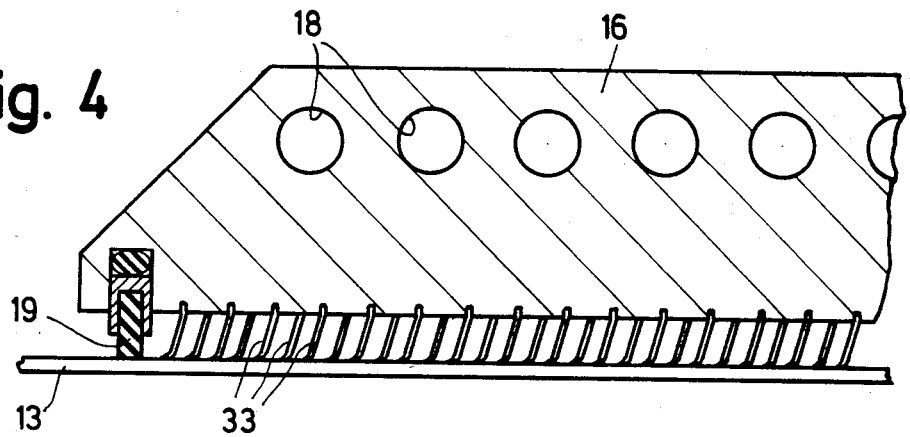
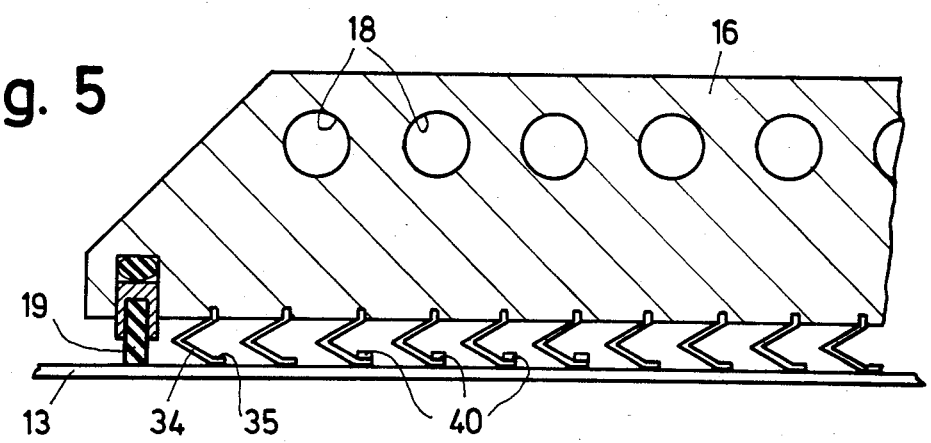

DUAL-BELT PRESS FOR THE CONTINUOUS PRODUCTION OF LAMINATES

The invention relates to a dual-belt press for the continuous production of laminates with two heated, rotating endless belts running over rollers, the laminate being guided between the opposite outsides of said belts, with heating plates which, through annularly enclosed seals, contact the insides of the endless belts, and with a fluid, pressure-cushion-forming pressure medium in the spaces formed by the seals, belt insides and heating plates to exert the necessary pressing force on the laminate.

Dual-belt presses of this kind (DE-OS No. 24 21 296) are used in particular for the manufacture of decorative laminates, particle boards, fibre boards, plywood boards, electro-laminates ("printed circuit boards") and other laminated materials. To achieve a high quality of the finished product, it is necessary during the passage of the laminate through the press to cure under pressure the binding agent (synthetic resin) contained in the laminate and to apply the requisite heat to the laminate. Since the heated endless belts only have a certain thermal capacity, the maximum amount of heat which can be transferred to the laminate is limited and is insufficient for many applications. The supply of additional heat through the heating plates and the fluid pressure medium is limited by the poor thermal conductivity of fluid media.

Although it is known to preheat the laminate before it enters the dual-belt press, for example by means of infra-red radiation, this can lead to an undesired precondensation of the resin contained in the laminate, with the result that the finished product is of inferior quality. Furthermore, the energy costs with this kind of heat transfer are uneconomically high and it is not possible in this way to produce a predetermined temperature gradient in the laminate during pressing, as would be advantageous for many applications.

The object of the invention is, in comparison to known arrangements, to improve the transfer of heat to the laminate in the region of the pressure cushion in a generic dual-belt press. In particular, it is intended, also in the reaction zone of the laminate limited by the pressure cushion, to be able to set a predetermined temperature profile or temperature gradient.

The object of the invention is achieved in that the spaces filled with the pressure cushion contain additional heat bridges which, in forming a good thermal conduction contact, are, on one side, connected to the heating plates and, on the other side, rubbingly contact the belt insides.

In a preferred embodiment of the invention the heat bridges can be lifted off the belt inside individually, in groups or all together, with the result that this makes it possible to set a given temperature distribution in the reaction zone.

With reference to the appended drawings, the following description of preferred embodiments serves to explain the invention in greater detail.

FIGS. 3 to 5 show various embodiments of heat bridges;

Figure 1:
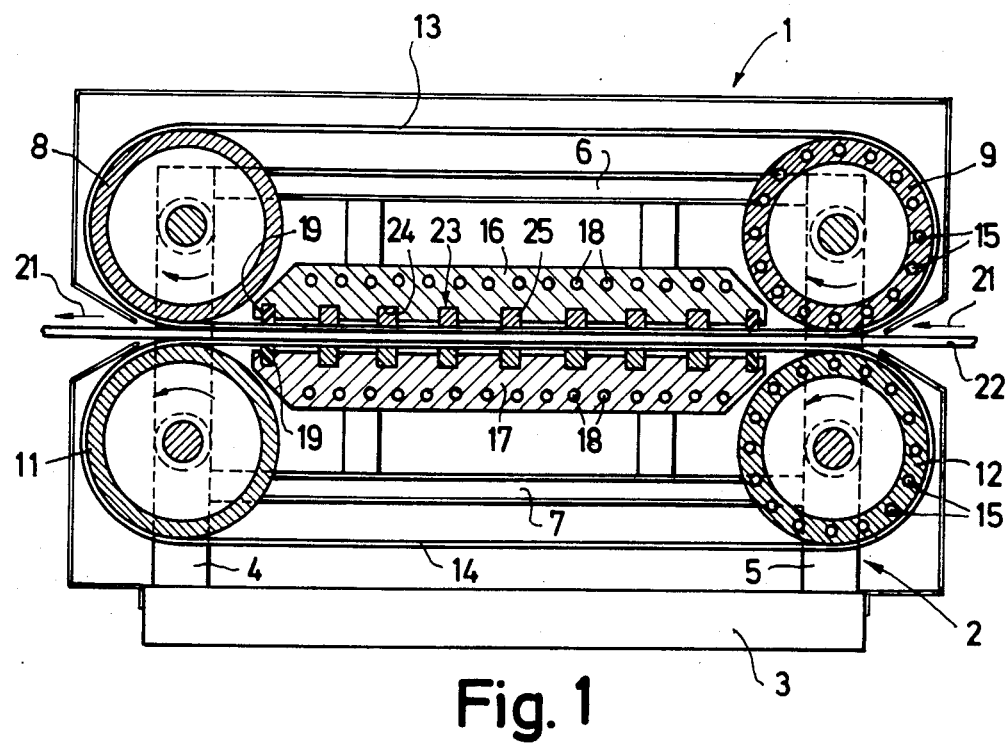
FIG. 1 shows a schematic sectional view of a dual-belt press.
Figure 2:
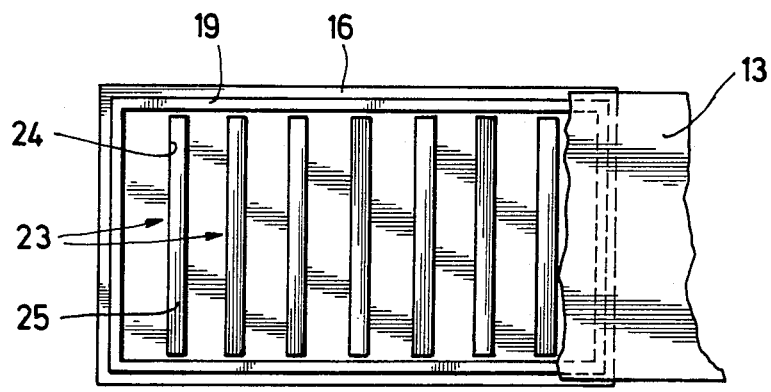
FIG. 2 shows a heating plate of the dual-belt press viewed from below.

The dual-belt press 1 shown in FIG. 1 for the continuous production of laminates exhibits a machine frame 2 which comprises a base 3, two uprights 4, 5 vertically disposed thereon and beams 6 and 7 connecting said uprights at top and bottom respectively. Four rollers 8, 9 and 11, 12 are rotatably mounted between the uprights 4, 5 and the beams 6, 7. The rollers 8, 9 form an upper roller pair; the rollers 11, 12 form a lower roller pair. An upper and a lower endless belt 13 and 14, respectively, is guided around each roller pair and tensioned by means which are not shown. The rollers 8, 11 are (in known manner and therefore not shown) driven in the direction of the arrow. They pull the endless belts 13 and 14 through the press so that their outsides are opposite each other in the centre region of the press and move horizontally and parallel to each other at identical speed. The other two rollers 9, 12 are heated in known manner, for example by means of thermo-oil which circulates in channels 15 in the jacket of the rollers 9, 12. The heat of the rollers 9 and 12 is transferred to the endless belts 13 and 14 respectively and is conveyed into the reaction zone between these belts in the centre region of the press.

Disposed in the centre region of the press and supported by the beams 6 and 7 are heating plates 16, 17 which may be heated electrically or by means of a flowing medium (thermo-oil). The thermo-oil circulates through channels 18 in the heating plates. On their sides facing each other the heating plates 16, 17 are provided with annularly enclosed seals 19 which are attached to the plates. These seals are in contact with the respective insides of the endless belts 13, 14 which extend parallel to each other at a given distance from each other. The seals 19 also laterally delimit the aforementioned reaction zone. The reaction zone is further delimited by the heating plates 16, 17. Through the intermediary of the annular seals 19 the heating plates 16, 17 are in contact under pressure with the insides of the belts 13, 14 such that a fluid pressure medium can be introduced into the space forming the reaction zone through lines (not shown) which penetrate the heating plates. The pressure medium is put under a certain pressure, for example 20 bar, and forms a pressure cushion which acts on the belt inside and presses the belt outside against the material 22 which is passing through the press in the direction of the arrows 21 and which is to be transformed into a laminate. The pressure medium may, for example, be air or oil. The seals 19 are in contact under pressure with the insides of the endless belts 13, 14 and act as a sliding surface seal. The heating plates 16, 17 are heated to a temperature which is higher than the desired temperature in the reaction zone.

Since the aforementioned fluid pressure medium is a poor conductor of heat, it is difficult to transfer heat in sufficient quantity from the heating plates 16, 17 to the endless belts. To remedy this difficulty, additional heat bridges made out of material of high thermal conductivity are disposed in the reaction zones filled with the pressure cushions. In providing a good thermal conduction contact, these heat bridges are, on one side, connected to the heating plates 16, 17 and, on the other side, rubbingly contact the insides of the endless belts 13, 14 in the region of the reaction zone. It has been found that this makes it possible to achieve a considerably better transfer of heat from the heating plates 16, 17 to the endless belts 13, 14 in the reaction zone and from these belts to the laminate 22 which is passing through the reaction zone.

As can be seen from FIG. 3, the upper heating plate 16—the same applies correspondingly to the lower heating plate 17—exhibits grooves 24 on its surface facing the inside of the endless belt 13. The heat bridges 23 are inserted in these grooves 24 for the purpose of producing a good thermal contact. The heat bridges 23 which are in the form of slide bars contact the belt 13 with their surfaces facing away from the grooves 24 and in this manner transfer the heat from the heating plate to the belt.

FIG. 3 shows the three different versions of heat bridges 23. In the first version a slide bar 25 is vertically inserted in the groove 24 such that it is slidingly displaceable. There is an elastic seal 26 between the bar 25 and the base of the groove 24. In the version shown in the centre in FIG. 3, the slide bar 25 is loaded by a spring section 27 which presses the bar 25 against the endless belt 13 in the same manner as the seal 26. Instead of the grooves 24, the surfaces of the heating plates 16, 17 facing the belt insides may also exhibit other recesses, e.g. bores, which are engaged—preferably in a slidingly displaceable manner—by complementary projections, e.g. pins, attached to the heat bridges 23, thereby providing a good thermal conduction contact. In the third version shown on the right in FIG. 3, the slide bar is in the form of a U-shaped section 28 and contains a metal, likewise U-shaped support core 29. The arrangement is covered at the top by a web 31 over which, in turn, there is an elastic seal 26. In the support core 29 there may be disposed a further core 30 consisting of elastic, particularly elastomeric material and pressing the U-shaped section 28 with good thermal conduction contact against the walls of the groove 24.

The above-described slide bars 25, 28 which serve as heat bridges consist of metal, preferably a powder-metallurgically produced alloy, in particular a copper alloy which is in the form of a porous metal matrix and contains graphite embedded in its pores as a lubricant. The embedded graphite serves as "lubrication" for the moving contact surfaces of slide bar and endless belt.

As can also be seen from FIG. 3, the aforementioned channels 18 in the heating plates 16, 17, said channels 18 conducting a fluid heating medium, may according to the invention also have a non-circular cross section, as is shown by reference symbol 32. As can be seen, the walls of the channel 32 exhibit axially extending recesses and projections which enlarge the surface area of the channel inside wall, thus providing better heat transfer. The projections and recesses may, for example, have the shape of grooves or furrows and webs. This likewise improves the transfer of heat from the heating plates to the endless belts.

In the embodiment of the invention presented in FIG. 4, the heat bridges are in the form of bristle-like elements 33 made of a material of high thermal conductivity, preferably metal, which are inserted into the heating plate 16 and whose free end rubbingly contacts the inside of the belt 13, transferring the heat from the plate 16 to the belt 13. The bristles may have a round or angular, or particularly an oblong cross section.

In the embodiment shown in FIG. 5, the heat bridges are in the form of spring elements 34 which may extend wholly or partially over the width of the heating plate 16. The spring elements 34 consist once again of metal, preferably of a curable copper-beryllium alloy which, in addition to good thermal conductivity, also has good sliding properties. The spring elements 34 contact the inside of the belt 13 with angled legs 35 under spring force, thereby providing a good transfer of heat. The legs 35 may be provided with permanent magnets 40 which press the legs with sliding contact against the inside of the steel belt 13. In this case, the legs 35 need not contact the inside of the belt with spring force.

Another possible way according to the invention of applying additional heat to the laminate 22 as it passes through the reaction zone is to generate frictional heat in the region of the reaction zone. For this purpose, as shown in the schematic representation in FIG. 6, friction bars 36 which are mounted in a bracket 37 are pressed against the insides of the belts 13 and 14 in the region of the reaction zones so that in the contact zone frictional heat is generated which additionally heats the endless belts in the reaction zone. As shown, the bracket 37 is engaged by a piston-cylinder unit 38 which is supported on the machine frame 2 and which delivers the necessary friction pressure. This pressure is adjustable and can be matched to the amount of frictional heat which is to be transferred.

The friction bars 36 are made of a material with not too low a sliding friction coefficient, particularly the aforementioned, powder-metallurgical copper alloy with embedded graphite. In the embodiment shown in FIG. 6, the pressing force generated with the unit 38 serves, in addition to the fluid pressure medium used, also to generate the necessary surface pressure on the laminate 22.

Figure 6:
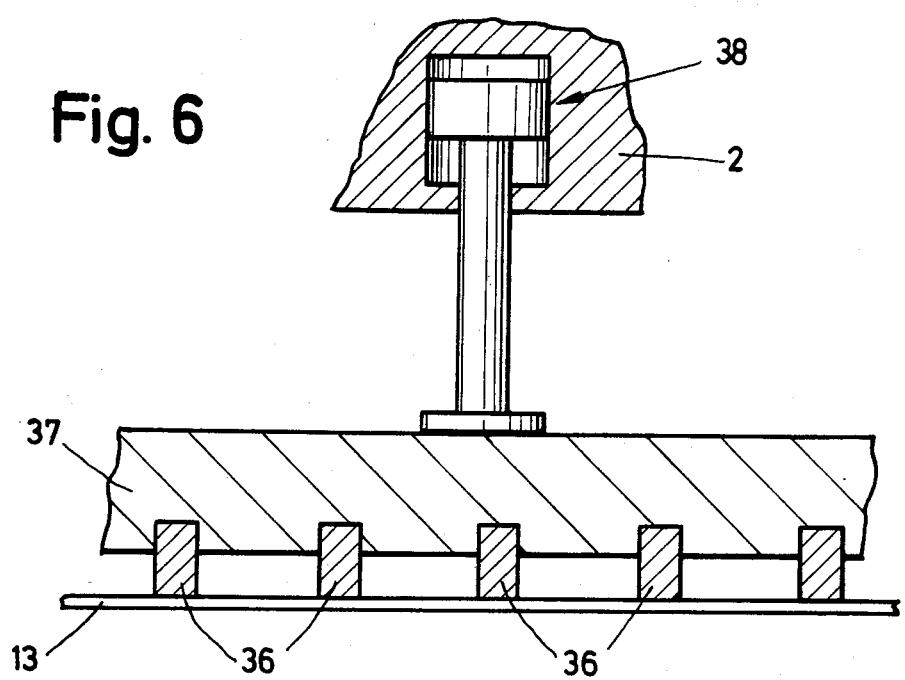
FIG. 6 shows height-adjustable friction bars.

In another embodiment of the arrangement in FIG. 6, the friction bars 36 may also at the same time be the heat bridges and serve to transfer the heat from the heating plates 16 to the endless belts. In this case, the bracket 37 is heated, for example, by the heating plates 16, 17.

Figure 7:
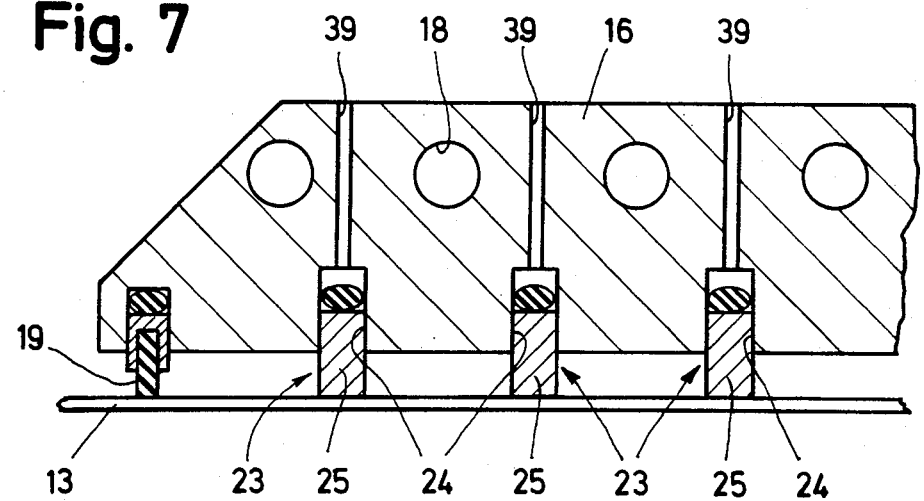
FIG. 7 shows heat bridges which can be switched on and off individually.

In another embodiment of the invention shown in FIG. 7, the heat bridges 23 which may be in the form shown in FIGS. 3, 4 and 5 are designed such that they can be switched on and off, with the result that, depending on the demand and depending on the desired location, additional heat can be introduced into the reaction zone. As shown in schematic form in FIG. 7, lines 39 issue from the base of the grooves 24 accepting the heat bridges 23. In known manner, an hydraulic or pneumatic pressure medium can be applied to these lines 39. In this way, when a suitable pressure is applied, it is possible for the heat bridges 23 which are slidingly held in the grooves 24 to be pressed against the inside of the endless belt 13. When the pressure is switched off, the heat bridges 23 are lifted off the endless belt 13 under the action of the pressure prevailing in the pressure cushion, with the result that there is no longer any transfer of heat. In the arrangement shown in FIG. 7, the heat bridges 23 can be pressed against the inside of the belt or lifted off the latter either individually, in groups or all together. Inside the pressure cushion it is possible (in a manner not shown) to provide known temperature sensors which scan the temperature of the reaction zone area by area and which trigger the switching on or off of the heat bridges area by area by means of known control means. In this way, it is possible for the temperature of the reaction zone to be precisely monitored and adapted so that the optimum amount of heat required for curing the resin contained in the laminate is supplied.

The on/off controllability of the heat bridges 23 shown in FIG. 7 can, in a further embodiment of the invention, also be suitably applied to the friction bars 36 shown in FIG. 6.

In a further embodiment of the invention, the heat bridges may also be in the form of metal pins or sleeves which are slidingly guided in bores of the heating plates 16, 17 and which are suitably distributed over the surface of the heating plate. The sleeves may be axially slotted and spring-loaded so that they are in good thermal contact with the bores of the heating plates.

What is claimed is:

1. Dual-belt press for the continuous production of laminates with two heated, rotating endless belts running over rollers, the laminate being guided between the opposite outsides of said belts, with heating plates which, through annularly enclosed seals, contact the insides of the endless belts, and with a fluid, pressure-cushion-forming pressure medium in the spaces formed by the seals, belt insides and heating plates to exert the necessary pressing force on the laminate, wherein the spaces filled with the pressure cushion contain additional heat bridges (23) which, in forming a good thermal conduction contact, are, on one side, connected to the heating plates (16, 17) and, on the other side, rubbingly contact the belt insides.

2. Press as defined in claim 1, wherein the surfaces of the heating plates (16, 17) facing the belt insides exhibit recesses which are engaged by complementary projections mounted on the heat bridges (23).

3. Press as defined in claim 1, wherein the surfaces of the heating plates (16, 17) facing the belt insides exhibit grooves (24) into which slide bars (25) are inserted as heat bridges, whereby a surface of said slide bars facing away from the groove is in contact with the belt inside.

4. Press as defined in claim 3, wherein the slide bars (25) consist of a metal matrix containing graphite as lubricant.

5. Press as defined in claim 4, wherein the slide bars (28) have a U-shaped cross section.

6. Press as defined in claim 3, wherein the slide bars (28) have a U-shaped cross section.

7. Press as defined in claim 6, wherein the U-sectioned slide bars (28) are pressed against the walls of the groove (24) by a flexible core (30).

8. Press as defined in claim 1, wherein the heat bridges are in the form of bristles (33).

9. Press as defined in claim 1, wherein the heat bridges are in the form of springs (34) which through their spring force are in contact with the belt insides.

10. Press as defined in any one of claims 1-3 or 8-9, wherein the heat bridges are pressed magnetically against the belt insides.

11. Press as defined in any one of claims 1-3 or 8-9, wherein friction bars (36) are provided which contact the belt insides with such pressure that in the area of contact additional heat of friction is generated in the belt (13, 14).

12. Press as defined in claim 11, wherein the heat bridges (23) and/or friction bars (36) can be lifted off the belt inside individually, in groups or all together.

13. Press as defined in claim 10, wherein the heat bridges (23) and/or friction bars (36) can, pneumatically or hydraulically, be pressed against the belt insides and/or lifted off the latter.

14. Press as defined in claim 1 wherein the heat bridges (23) can be lifted off the belt inside individually, in groups or all together.

15. Press as defined in any one of claims 1-3, 8-9, or 14, wherein the heating plate (16, 17) exhibits channels (32) to accept a heating fluid whereby, by means of recesses or projections, the walls of the channels have an enlarged surface area for the purpose of better heat transfer.

* * * * *